(12) United States Patent
Yamahira

(10) Patent No.: US 8,519,778 B2
(45) Date of Patent: Aug. 27, 2013

(54) SEMICONDUCTOR INTEGRATED CIRCUIT AND BOOSTER CIRCUIT INCLUDING THE SAME

(75) Inventor: Seiji Yamahira, Kyoto (JP)

(73) Assignee: Panasonic Corporation, Osaka (JP)

(*) Notice: Subject to any disclaimer, the term of this patent is extended or adjusted under 35 U.S.C. 154(b) by 136 days.

(21) Appl. No.: 13/160,007

(22) Filed: Jun. 14, 2011

(65) Prior Publication Data

US 2011/0241635 A1   Oct. 6, 2011

Related U.S. Application Data

(63) Continuation of application No. PCT/JP2010/006801, filed on Nov. 19, 2010.

(30) Foreign Application Priority Data

Dec. 3, 2009   (JP) .................................. 2009-275274

(51) Int. Cl.
*G05F 1/10* (2006.01)

(52) U.S. Cl.
USPC .............................. 327/536; 327/530; 326/27

(58) Field of Classification Search
USPC .................. 307/103, 11, 113; 327/380–383, 327/539, 538, 530, 512; 323/315, 907; 326/17, 326/27

See application file for complete search history.

(56) References Cited

U.S. PATENT DOCUMENTS

| | | | |
|---|---|---|---|
| 4,214,174 A | | 7/1980 | Dickson |
| 4,518,873 A | * | 5/1985 | Suzuki et al. .................. 326/86 |
| 4,894,561 A | * | 1/1990 | Nogami ........................ 326/27 |
| 4,959,563 A | * | 9/1990 | Schenck ........................ 326/27 |
| 5,621,342 A | * | 4/1997 | Wong et al. ................... 327/108 |
| 5,672,983 A | * | 9/1997 | Yamamoto et al. ............. 326/27 |
| 5,898,315 A | * | 4/1999 | Knaack .......................... 326/17 |
| 7,023,260 B2 | | 4/2006 | Thorp et al. |
| 7,411,318 B2 | * | 8/2008 | Kimura ........................ 307/113 |
| 2002/0067201 A1 | | 6/2002 | Butler |
| 2009/0015318 A1 | | 1/2009 | Honda |

FOREIGN PATENT DOCUMENTS

| | | |
|---|---|---|
| JP | 2002-171747 | 6/2002 |
| JP | 2009-021841 | 1/2009 |
| JP | 2009-044870 | 2/2009 |

* cited by examiner

*Primary Examiner* — Rajnikant Patel

(74) *Attorney, Agent, or Firm* — McDermott Will & Emery LLP

(57) ABSTRACT

A semiconductor integrated circuit includes: a first transistor and a second transistor connected in series between a first voltage and a second voltage; a first inverter configured to control the first transistor; a second inverter configured to control the second transistor; and a current source, wherein the current source is connected in series with at least one of the first inverter or the second inverter.

24 Claims, 14 Drawing Sheets

| VDD | Sigvd[3:1] | Sigtpp[2:1] |
|-----|------------|-------------|
| Vd0 | LLL | LL |
| Vd1 | LLH | LH |
| Vd2 | LHH | HL |
| Vd3 | HHH | HH |

| Vdd | Sigvd[3:1] | Sigfosc[2:1] | Sigtpp[2:1] |
|---|---|---|---|
| Vd0 | LLL | LL | LL |
| Vd1 | LLH | LH | LH |
| Vd2 | LHH | HL | HL |
| Vd3 | HHH | HH | HH |

SEMICONDUCTOR INTEGRATED CIRCUIT AND BOOSTER CIRCUIT INCLUDING THE SAME

CROSS-REFERENCE TO RELATED APPLICATION

This is a continuation of PCT International Application PCT/JP2010/006801 filed on Nov. 19, 2010, which claims priority to Japanese Patent Application No. 2009-275274 filed on Dec. 3, 2009. The disclosures of these applications including the specifications, the drawings, and the claims are hereby incorporated by reference in their entirety.

BACKGROUND

The present disclosure relates to driver circuits configured to reduce high frequency noise, and is applicable to, in particular, booster circuits, etc.

In recent years, for flash memories, which are a type of nonvolatile storage devices, there has been a demand for data read operation and data rewrite operation which are performed with a single power supply voltage, low power supply voltages, or within a range from a low power supply voltage to a high power supply voltage. To perform each operation, an on-chip booster circuit for supplying a boosted voltage or a negative boosted voltage is required. On the other hand, for semiconductor devices to which the flash memories are mounted, there has been a demand for a reduction in high frequency noise, and improvement of high frequency noise resistance.

Generally, the boosted current capability ipp of a booster circuit is expressed by $fosc \times Cp \times VL$, where fosc is the booster clock frequency, Cp is the boosting capacitor, and VL is the potential difference between an upstream stage and a downstream stage of a boosting cell when boosting is performed. In conventional booster circuits, a boosting capacitor is pumped in synchronization with a relatively high booster clock frequency in order to obtain a high boosted current capability. For this reason, the current capability of a transistor of a driver circuit pumping the boosting capacitor is increased in order to ensure a sufficient margin for a charge transfer time period to alleviate boosting efficiency degradation. Thus, during logic transition of the driver circuit, a relatively large amount of current flows from a power supply terminal in a direction of the boosting capacitor, or from the boosting capacitor in a direction of ground in a short period of time. A relatively high rate of change in amount of the current acts as high frequency noise, which reduces operating margins of other circuits. Therefore, reducing the rate of change in amount of the current at the power supply terminal and ground generated by the driver circuit of the booster circuit has been a technique required to ensure the operating margins of other circuits.

To reduce the rate of change in amount of the current flowing through the driver circuit of the booster circuit, outputs of inverter circuits which are different from each other in size may be applied to gates of p-channel and n-channel transistors of the driver circuit of the booster circuit (see, for example, Japanese Patent Publication 2002-171747). Here, properly setting the size of each inverter circuit can extend a time period during which the p-channel and n-channel transistors transition from a non-conductive state to a conductive state. As a result, the rate of change in amount of the current flowing through the driver circuit decreases, so that high frequency noise can be reduced.

SUMMARY

However, in the conventional booster circuits, the rise time and the fall time of an output voltage of the driver circuit are adjusted by the current capability of the inverter circuits connected to the gates of the p-channel transistor and the n-channel transistor of the driver circuit. Here, the rise time of an output voltage of the inverter circuit is about $(3.85 \times C)/(\beta p \times Vdd)$, where C is the output load capacitance of the inverter circuit, $\beta p$ is the gain coefficient of the p-channel transistor of the inverter circuit, and Vdd is the power supply voltage, and the fall time is about $(3.85 \times C)/(\beta n \times Vdd)$, where $\beta n$ is the gain coefficient of the n-channel transistor of the inverter circuit.

In the above expressions, when the power supply voltage (swing voltage of the inverter) increases, the rise time and the fall time of the inverter circuit shorten. Therefore, as the power supply voltage increases, transition time periods of the p-channel transistor and the n-channel transistor of the driver circuit controlled by the inverter circuit shorten, which may increase high frequency noise.

A booster circuit including a semiconductor integrated circuit of the present disclosure can reduce high frequency noise. An example semiconductor integrated circuit of the present disclosure includes: a first transistor and a second transistor which are connected in series between a first voltage and a second voltage; a first inverter configured to control the first transistor; a second inverter configured to control the second transistor; and a current source. The current source is connected in series with at least one of the first inverter or the second inverter.

With this configuration, the quantity of electric charge at an output node of at least one of the first inverter or the second inverter is adjusted based on the amount of current of the current source. Thus, the output voltage of the inverter connected to the current source can be changed based on the amount of the current of the current source. Therefore, the transistor controlled by the inverter can be switched between the conductive state and the non-conductive state during a time period based on the amount of the current of the current source.

Preferably, the current source is a constant current source to which a constant voltage is applied. With this configuration, the quantity of electric charge at the output node of the inverter connected to the constant current source changes at a constant rate, so that the transistor controlled by the inverter can gradually be switched between the conductive state and the non-conductive state. Here, the constant voltage may be a voltage having a smaller voltage-fluctuation than the first voltage. Although not shown, the constant voltage can be obtained by using an output voltage of a reference voltage generation circuit, a regulator circuit, or the like.

Moreover, the current source is preferably configured to switch between a plurality of current values. With this configuration, a time period required for the transistor controlled by the inverter connected to the current source to switch between the conductive state and the non-conductive state can be adjusted based on the current values.

DETAILED DESCRIPTION

First Embodiment

-Configuration of Booster Circuit-

Figure 1:
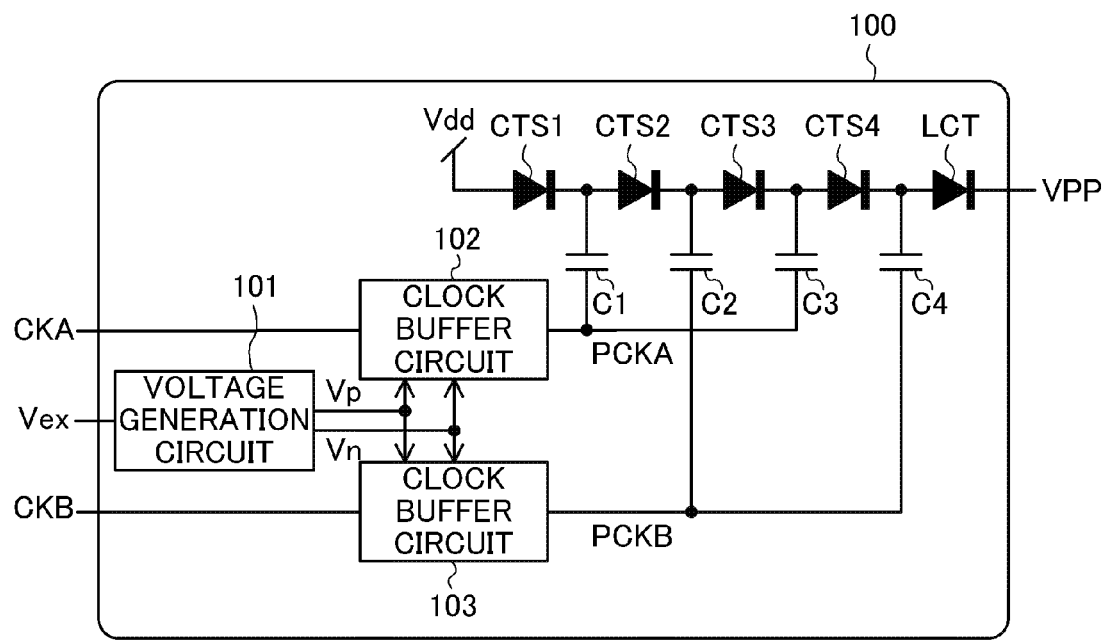
FIG. 1 is a view illustrating a configuration of a booster circuit of a first embodiment.

FIG. 1 illustrates a configuration of a booster circuit 100 of a first embodiment. Charge transfer sections CTS1-CTS4 are configured to transfer charge from an upstream stage to a downstream stage. Reference symbol LCT denotes a backflow preventing section. Boosting capacitors C1-C4 are provided downstream of the charge transfer sections CTS1-CTS4, respectively. A voltage generation circuit 101 is configured to generate a voltage Vp based on a power supply voltage, and a voltage Vn based on ground from a constant voltage Vex generated outside a chip, the a constant voltage Vex having little dependence on the power supply voltage. Note that the voltage Vex may be generated in the chip. A clock buffer circuit 102 is connected to one end of the boosting capacitor C1 and one end of the boosting capacitor C3. The voltage Vp and the voltage Vn are applied to the clock buffer circuit 102. The clock buffer circuit 102 outputs, in synchronization with a clock signal CKA, a clock signal PCKA to pump the boosting capacitors C1, C3. A clock buffer circuit 103 is connected to one end of the boosting capacitor C2 and one end of the boosting capacitor C4. The configuration of the clock buffer circuit 103 is similar to that of the clock buffer circuit 102. The clock buffer circuit 103 outputs, in synchronization with a clock signal CKB, a clock signal PCKB to pump the boosting capacitors C2, C4. The booster circuit 100 operates in synchronization with the clock signals CKA, CKB to perform boosting operation.

-Configuration of Voltage Generation Circuit-

Figure 2:
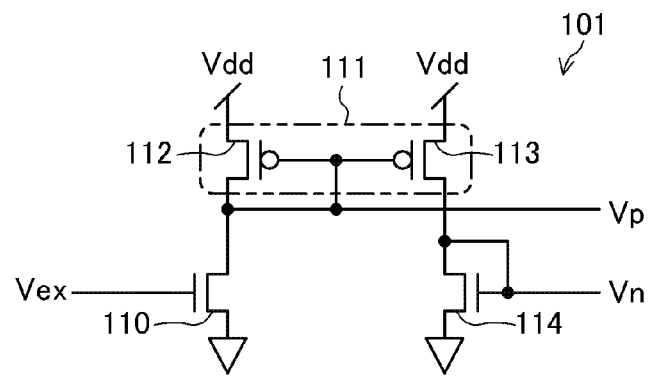
FIG. 2 is a view illustrating a configuration of a voltage generation circuit of the first embodiment.

FIG. 2 illustrates an example of the voltage generation circuit 101. An n-channel transistor 110 includes a gate to which the external power supply voltage Vex, which is a constant voltage, is applied. A current mirror circuit 111 includes p-channel transistors 112, 113, and outputs the voltage Vp. An n-channel transistor 114 is a diode-connected transistor, and outputs the voltage Vn.

-Configuration of Clock Buffer Circuit-

Figure 3:
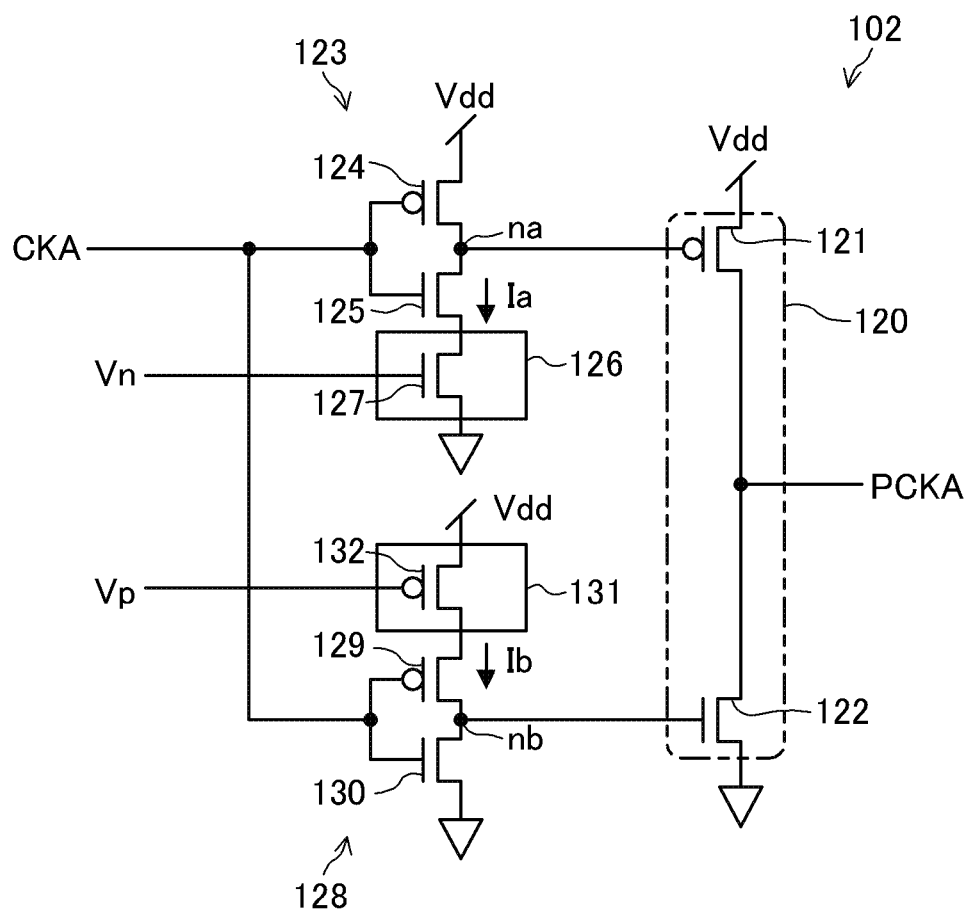
FIG. 3 is a view illustrating a configuration of a semiconductor integrated circuit of the first embodiment.

FIG. 3 illustrates an example of the clock buffer circuit 102. A driver circuit 120 includes a p-channel transistor 121 and an n-channel transistor 122, and outputs the clock signal PCKA to pump the boosting capacitors C1, C3. An inverter circuit 123 includes a p-channel transistor 124 and an n-channel transistor 125, and drives the p-channel transistor 121 between a power supply voltage Vdd and ground in synchronization with the clock signal CKA. A current source 126 includes an n-channel transistor 127 connected between the n-channel transistor 125 and ground, the n-channel transistor 127 having a gate to which the voltage Vn as a bias voltage is applied. Note that the current source 126 may be connected between an intermediate terminal na and the n-channel transistor 125, or may be connected in series with the inverter circuit 123.

Here, a time period ta during which a voltage at the intermediate terminal na of the inverter circuit 123 transitions from "H" to "L" can be expressed by Ca×Vdd/Ia, where Ca is the load capacitance of the inverter circuit 123 including the gate capacitance of the p-channel transistor 121, the parasitic capacitance of the intermediate terminal na, and the drain diffusion capacitance of the p-channel transistor 124 and the n-channel transistor 125, and Ia is a drain current when the voltage Vn is applied to the gate of the n-channel transistor 127. The load capacitance Ca and the current Ia are constant, and thus the time period ta is proportional to the power supply voltage Vdd.

An inverter circuit 128 includes a p-channel transistor 129 and an n-channel transistor 130, and drives the n-channel transistor 122 between the power supply voltage Vdd and ground in synchronization with the clock signal CKA. A current source 131 includes a p-channel transistor 132 connected between the power supply voltage Vdd and the p-channel transistor 129, the p-channel transistor 132 having a gate to which the voltage Vp as a bias voltage is applied. Note that the current source 131 may be connected, for example, between the p-channel transistor 129 and an intermediate terminal nb, or may be connected in series with the inverter circuit 128.

Here, a time period tb during which a voltage at the intermediate terminal nb of the inverter circuit 128 transitions from "L" to "H" can be expressed by Cb×Vdd/Ib, where Cb is the load capacitance of the inverter circuit 128 including the gate capacitance of the n-channel transistor 122, the parasitic capacitance of the intermediate terminal nb, and the drain diffusion capacitance of the p-channel transistor 129 and the n-channel transistor 130, and Ib is a drain current when the voltage Vn is applied to the gate of the p-channel transistor 132. The load capacitance Cb and the current Ib are constant, and thus the time period tb is proportional to the power supply voltage Vdd.

-Operation-

Figure 4:
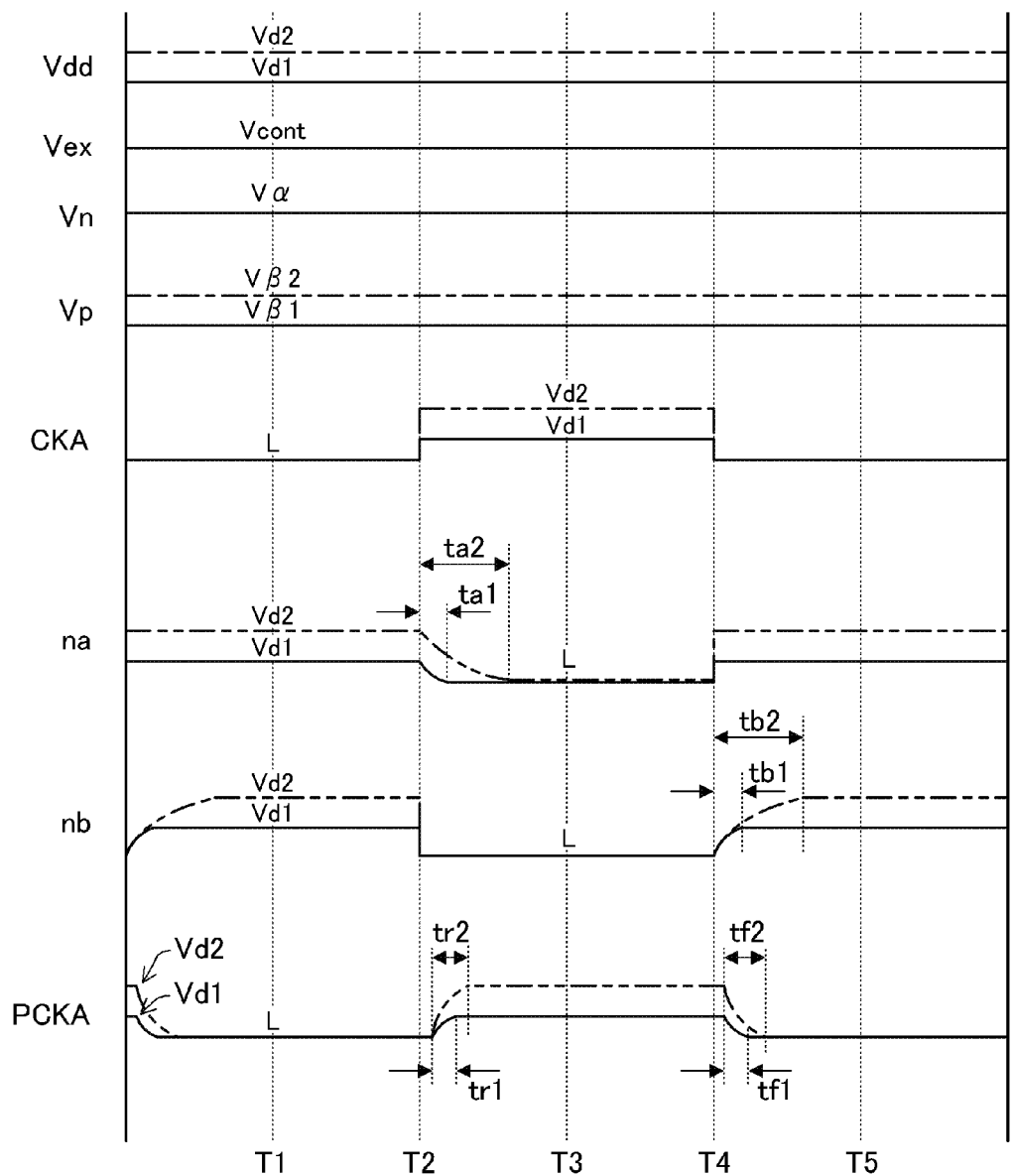
FIG. 4 is a timing chart of the booster circuit of the first embodiment.

Next, with reference to FIG. 4, operation of the clock buffer circuit 102 to which the clock signal CKA is input will mainly be described as operation of the booster circuit 100. Note that the amplitude of the clock signal CKA varies between the power supply potential Vdd and ground. Operation of the clock buffer circuit 103 is similar to that of the clock buffer circuit 102, and thus the description thereof is omitted.

Initially, at time T1, the clock signal CKA is "L", voltages at the intermediate terminals na, nb are both "H", and the clock signal PCKA is "L." Here, solid lines in the figure indicate that the power supply voltage Vdd is Vd1, and broken lines indicate that the power supply voltage Vdd is Vd2 which is higher than Vd1. Moreover, the constant voltage Vex is a voltage Vcont which is substantially constant irrespective of the power supply voltage Vdd. The voltage generation circuit 101 keeps the voltage Vn at Vα having no voltage dependence so that the n-channel transistor 127 and the p-channel transistor 132 operate as constant current sources. The voltage Vp depends on the power supply voltage. When the power supply voltage Vdd is Vd1, the voltage Vp is Vfβ1. When the power supply voltage Vdd is Vd2, the voltage Vp is Vfβ2.

At time T2, the clock signal CKA transitions from "L" to "H." This allows logic transition of an output of the inverter circuit 128, so that the voltage at the intermediate terminal nb transitions to "L," and thus the n-channel transistor 122 transitions from a conductive state to a non-conductive state. Here, the transition of the n-channel transistor 122 from the conductive state to the non-conductive state occurs earlier than the transition of the p-channel transistor 121 from the non-conductive state to the conductive state.

Logic transition of an output of the inverter circuit 123 starts substantially simultaneously with the logic transition of the output of the inverter circuit 128, and the current Ia starts flowing from the intermediate terminal na to ground via the current source 126. The voltage at the intermediate terminal na gradually transitions from "H" to "L" during a time period ta1=Ca×Vdd/Ia, and thus the p-channel transistor 121 gradually transitions from the non-conductive state to the conductive state during a time period tr1. This causes slow logic transition of the clock signal PCKA from "L" to "H," thereby pumping the boosting capacitors C1, C3.

Note that when the power supply voltage Vdd is Vd2, a time period during which the voltage at the intermediate terminal na transitions from "H" to "L" is ta2, and thus a time period during which the p-channel transistor 121 transitions from the non-conductive state to the conductive state is tr2. Thus, the ratio between the time period ta1 and the time period ta2 is ta2/ta1=Vd2/Vd1 based on the above expression.

As described above, the current source 126 is provided to keep the current Ia of the inverter circuit 123 constant, and to discharge the charge of the intermediate terminal na at a constant amount of current, so that a transition time period of the intermediate terminal na can be proportional to the power supply voltage Vdd. In a conventional configuration, the transition time period shortens in inverse proportion to the power supply voltage, and thus the ratio between the present configuration and the conventional configuration in terms of the time period during which the voltage at the intermediate terminal na transitions from "H" to "L" is proportional to "the square of Vdd." The present embodiment allows slow transition of the voltage at the intermediate terminal na even when the power supply voltage Vdd is high. This allows slow transition of the p-channel transistor 121 from the non-conductive state to the conductive state through the voltage transition of the p-channel transistor 121, so that high frequency noise can be reduced compared to the conventional configuration.

At time T3, the clock signal CKA remains "H," the voltages at the intermediate terminals na, nb both remain "L," and the clock signal PCKA remains "H."

At time T4, the clock signal CKA transitions from "H" to "L." This allows logic transition of the output of the inverter circuit 123, so that the voltage at the intermediate terminal na transitions to "H," and thus the p-channel transistor 121 transitions from the conductive state to the non-conductive state. Here, the transition of the p-channel transistor 121 from the conductive state to the non-conductive state occurs earlier than the transition of the n-channel transistor 122 from the non-conductive state to the conductive state.

The logic transition of the output of the inverter circuit 128 starts substantially simultaneously with the logic transition of the output of the inverter circuit 123, and the current Ib starts flowing from the power supply voltage to the intermediate terminal nb via the current source 131. The voltage at the intermediate terminal nb gradually transitions from "L" to "H" during a time period tb1=Cb×Vdd/Ib, and thus the n-channel transistor 122 gradually transitions from the non-conductive state to the conductive state during a time period tf1. This causes slow logic transition of the clock signal PCKA from "H" to "L," so that the charge transfer sections CTS1, CTS3 transfer charge outside.

Note that when the power supply voltage Vdd is Vd2, a time period during which the voltage at the intermediate terminal nb transitions from "L" to "H" is tb2, and thus a time period during which the n-channel transistor 122 transitions from the non-conductive state to the conductive state is tf2. The ratio between the time period tb1 and the time period tb2 is tb2/tb1=Vd2/Vd1 based on the above expression.

As described above, the current source 131 is provided to keep the current Ib of the inverter circuit 128 constant, and to charge the charge of the intermediate terminal nb at a constant amount of current, so that a transition time period of the intermediate terminal nb can be proportional to the power supply voltage Vdd. In a conventional configuration, the transition time period shortens in inverse proportion to the power supply voltage, and thus the ratio between the present configuration and the conventional configuration in terms of the time period in which the voltage at the intermediate terminal nb transitions from "L" to "H" is proportional to "the square of Vdd." The present embodiment allows slow transition of the voltage at the intermediate terminal nb even when the power supply voltage Vdd is high. This allows slow transition of the n-channel transistor 122 from the non-conductive state to the conductive state through the voltage transition of the n-channel transistor 122, so that high frequency noise can be reduced compared to the conventional configuration. After time T5, operation similar to that described above is repeated to repeat the boosting operation.

-Advantages-

As described above, in the present embodiment, the current of the inverter circuit 123 configured to control the p-channel transistor 121 is limited by the current source 126 during the logic transition from "H" to "L," and the current of the inverter circuit 128 configured to control the n-channel transistor 122 is limited by the current source 131 during the logic transition from "L" to "H." Thus, even when the power supply voltage Vdd is high, an increase in high frequency noise can be limited to a lesser extent. Moreover, timing of the logic transition respectively of the p-channel transistor 121 and the n-channel transistor 122 can easily be controlled, so that it is possible to reduce a through current generated during the logic transition of the output of the driver circuit 120.

Note that configurations of the charge transfer sections CTS1-CTS4, and the backflow preventing section LCT may not be limited to those of the embodiment. For example, the configuration disclosed in U.S. Pat. No. 4,214,174, and the configuration disclosed U.S. Pat. No. 7,023,260B2 may be possible, and each may use the configuration of FIG. 3 as a clock buffer circuit to provide advantages similar to those described above.

As to the voltage characteristics of the constant voltage Vex, the constant voltage Vex is not necessarily constant as long as the variation of the constant voltage Vex is smaller than that of the power supply voltage Vdd. Moreover, the voltage Vp and the voltage Vn may be generated in other circuits than the booster circuit 100.

Furthermore, one of the current source 126 and the current source 131 may be omitted.

Second Embodiment

-Configuration of Booster Circuit-

Figure 5:
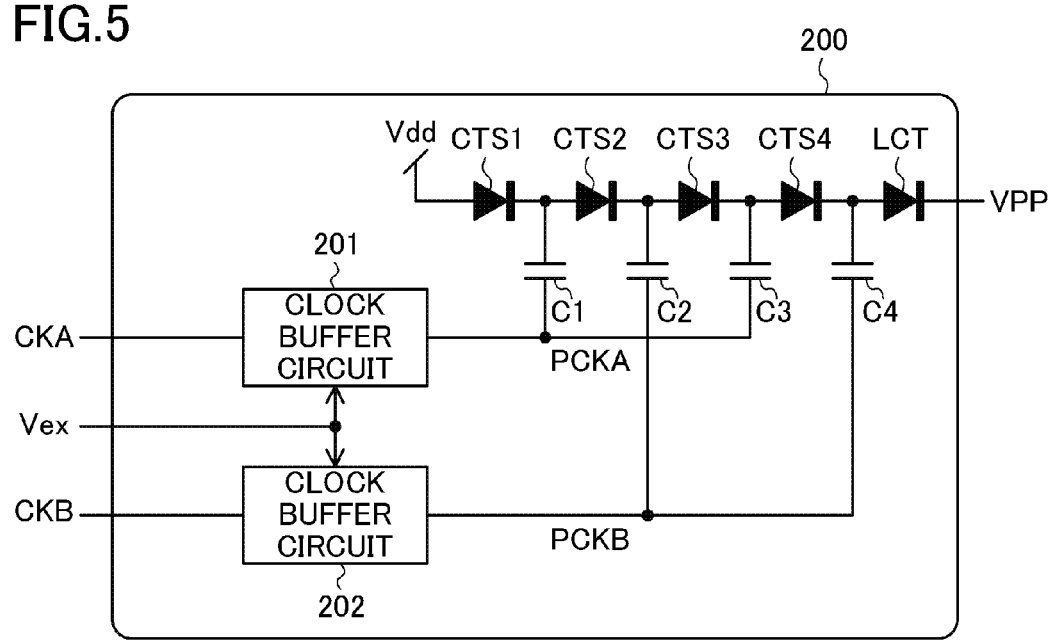
FIG. 5 is a view illustrating a configuration of a booster circuit of a second embodiment.

FIG. 5 illustrates a configuration of a booster circuit 200 of a second embodiment. The booster circuit 200 is different from the booster circuit 100 of FIG. 1 in that the voltage generation circuit 101 is omitted, and the clock buffer circuits 102, 103 are replaced with clock buffer circuits 201, 202, respectively. The differences between the second embodiment and the first embodiment will be described below.

-Configuration of Clock Buffer Circuit-

Figure 6:
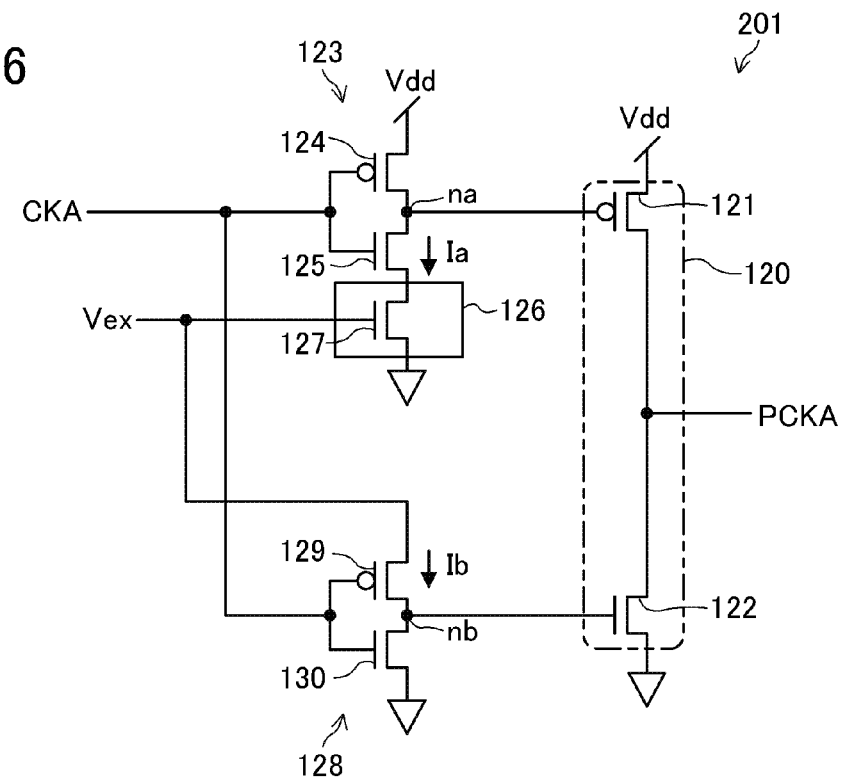
FIG. 6 is a view illustrating a configuration of a semiconductor integrated circuit of the second embodiment.

FIG. 6 is a view illustrating a configuration of the clock buffer circuit 201 of the present embodiment. Note that since the configuration of the clock buffer circuit 202 is similar to that of the clock buffer circuit 201, the description thereof is omitted, and the configuration of the clock buffer circuit 201 will be described.

The clock buffer circuit 201 is different from the clock buffer circuit 102 of FIG. 3 in that the current source 131 is omitted, a constant voltage Vex is applied to the gate of an n-channel transistor 127 of a current source 126 and to a source of a p-channel transistor 129 of an inverter circuit 128, for example, from an external power supply voltage, and the inverter circuit 128 is driven between the constant voltage Vex and ground.

-Operation-

Figure 7:
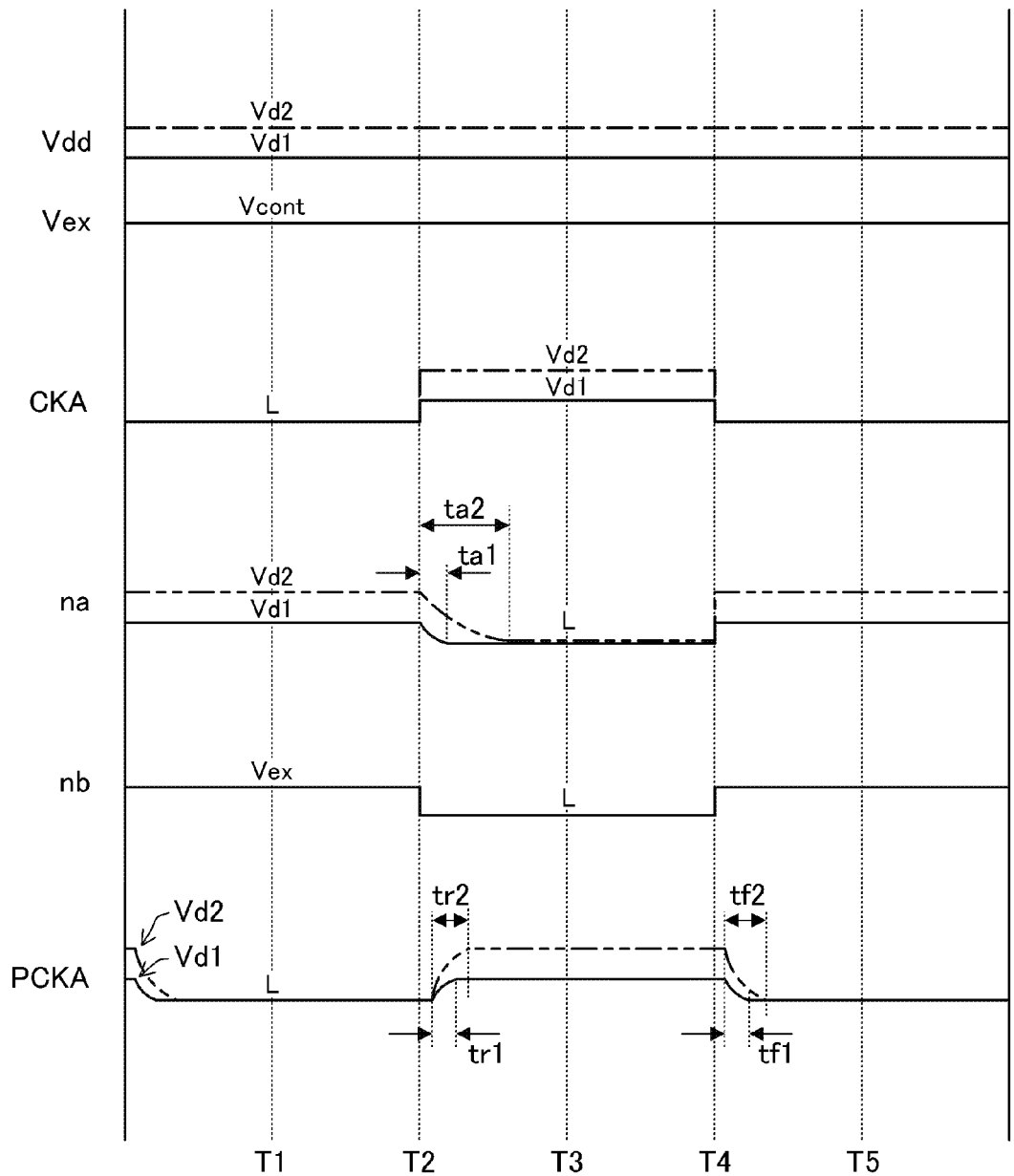
FIG. 7 is a timing chart of the booster circuit of the second embodiment.

Next, with reference to FIG. 7, operation of the clock buffer circuit 201 will be described. Initially, at time T1, a clock signal CKA is "L," an intermediate terminal na is applied with a voltage Vdd, and has a logical value of "H," an intermediate terminal nb is applied with the voltage Vex, and has a logical value of "H," and a clock signal PCKA is "L."

The constant voltage Vex is a constant voltage Vcont irrespective of the power supply voltage Vdd. A voltage at the intermediate terminal na transitions between the power supply voltage Vdd (logical value "H") and ground (logical value "L") based on an output of an inverter circuit 123. A voltage at the intermediate terminal nb transitions between the constant voltage Vex (logical value "H") and ground (logical value "L") based on the inverter circuit 128.

At time T2, the clock signal CKA transitions from "L" to "H." As a result, the voltage at the intermediate terminal nb transitions to "L," so that an n-channel transistor 122 transitions from a conductive state to a non-conductive state.

Moreover, a current Ia starts flowing from the intermediate terminal na to ground via the current source 126. The voltage at the intermediate terminal na gradually transitions from "H" to "L" during a time period ta1=Ca×Vdd/Ia, and thus a p-channel transistor 121 gradually transitions from the non-conductive state to the conductive state during a time period tr1. This causes slow logic transition of the clock signal PCKA from "L" to "H", so that boosting capacitors C1, C3 are pumped.

At time T4, the clock signal CKA transitions from "H" to "L." As a result, the voltage at the intermediate terminal na transitions to "H," and thus the p-channel transistor 121 transitions from the conductive state to the non-conductive state.

Moreover, a current Ib starts flowing from the constant voltage Vex to the intermediate terminal nb. The voltage at the intermediate terminal nb transitions from "L" to "H" during a time period tb1=Cb×Vex/Ib. Since the constant voltage Vex is applied to the gate of the n-channel transistor 122 irrespective of the power supply voltage Vdd, the n-channel transistor 122 operates as a constant current source, and gradually transitions from the non-conductive state to the conductive state during a time period tf1. This causes slow logic transition of the clock signal PCKA from "H" to "L."

Here, the inverter circuit 128 is driven between the constant voltage Vex and ground, so that the constant voltage Vex is applied to the gate of the n-channel transistor 122 when the voltage at the intermediate terminal nb is "H." That is, when the voltage at the intermediate terminal nb is "H," the n-channel transistor 122 operates in the same state as the n-channel transistor 127 of the current source 126, so that the n-channel transistor 122 can be driven as a constant current source. Therefore, the clock signal PCKA can transition from "H" to "L" during the transition time period tf1. Since the n-channel transistor 122 operates as the constant current source, the voltage of the clock signal PCKA can slowly transitions even when the power supply voltage is high. The effect that the high frequency noise can be reduced compared to conventional configuration can be expected.

<Advantages>

As described above, in the present embodiment, driving the inverter circuit 128 at the constant voltage Vex can limit an increase in high frequency noise to a lesser extent particularly when clock signals PCKA, PCKB transition from "H" to "L". Moreover, since the number of elements may be smaller in the clock buffer circuit 201 of the present embodiment than in the clock buffer circuit 102 of FIG. 3, the circuit area of the clock buffer circuit 201 can be reduced. Moreover, the inverter circuit 128 driven at the constant voltage Vex can be configured using a transistor having a low breakdown voltage (a small thickness of an oxide film) compared to the inverter circuit 123 driven at the power supply voltage Vdd, and thus the circuit area can further be reduced.

Note that a voltage applied to the gate of the n-channel transistor 127 serving as the current source 126 may be different from a voltage applied to the source of the p-channel transistor 129 of the inverter circuit 128. For example, advantages similar to those obtained in the present embodiment can be produced also by applying a reference voltage Vref to the gate of the n-channel transistor 127 and the constant voltage Vex to the source of the p-channel transistor 129.

Third Embodiment

Figure 8:
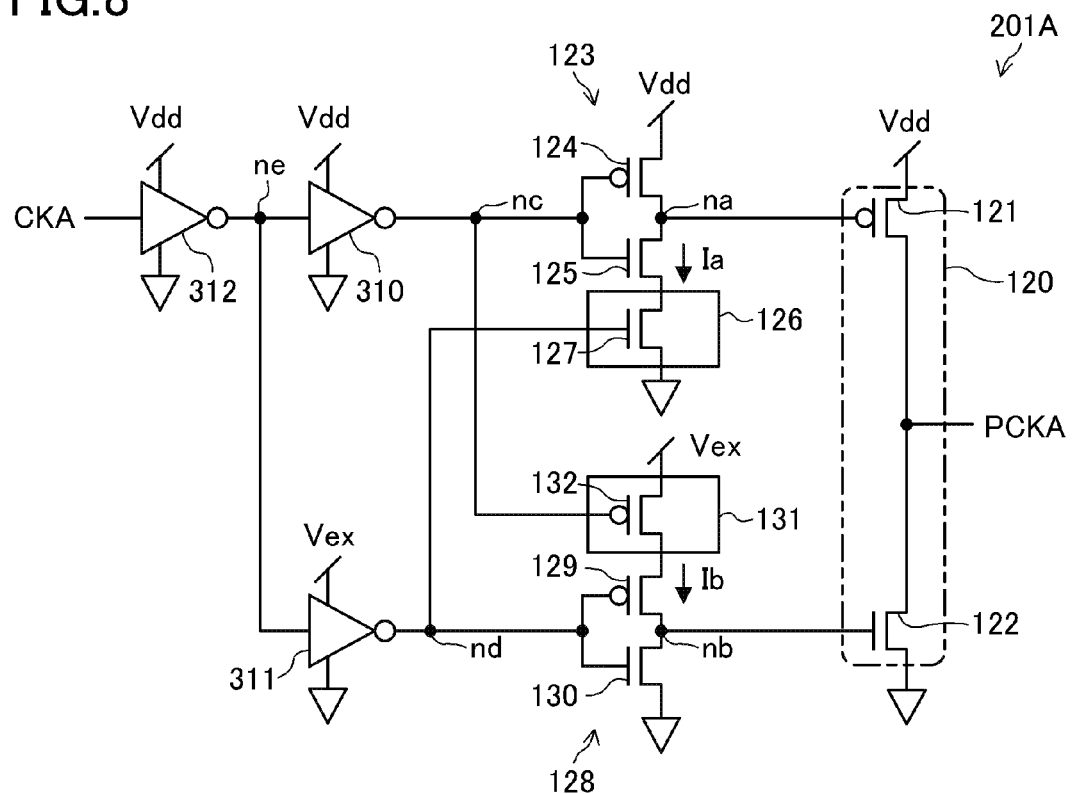
FIG. 8 is a view illustrating a configuration of a semiconductor integrated circuit of a third embodiment.

FIG. 8 is a view illustrating a configuration of a clock buffer circuit 201A of a third embodiment. The differences between the third embodiment and the second embodiment will be described below.

-Configuration of Clock Buffer Circuit-

In the clock buffer circuit 201A, the gate of an n-channel transistor 127 of a current source 126 is connected to an intermediate terminal nd, and a current source 131 is connected in series with a source current path of an inverter circuit 128. The gate of a p-channel transistor 132 of the current source 131 is connected to an intermediate terminal nc. The intermediate terminal nd is connected to an inverter circuit 311 which operates between a constant voltage Vex and ground. The intermediate terminal nc is connected to an inverter circuit 310 which operates between a power supply voltage Vdd and ground.

An inverter circuit 312 operates between the power supply voltage Vdd and ground in synchronization with a clock signal CKA, and controls the inverter circuits 310, 311 via an intermediate terminal ne. That is, the inverter circuits 310, 312 form a buffer circuit, and the inverter circuits 311, 312 form a buffer circuit. Note that a configuration of a clock buffer circuit to which a clock signal CKB is input is similar to that of the clock buffer circuit 201A, and thus the description thereof is omitted.

-Operation-

Figure 9:
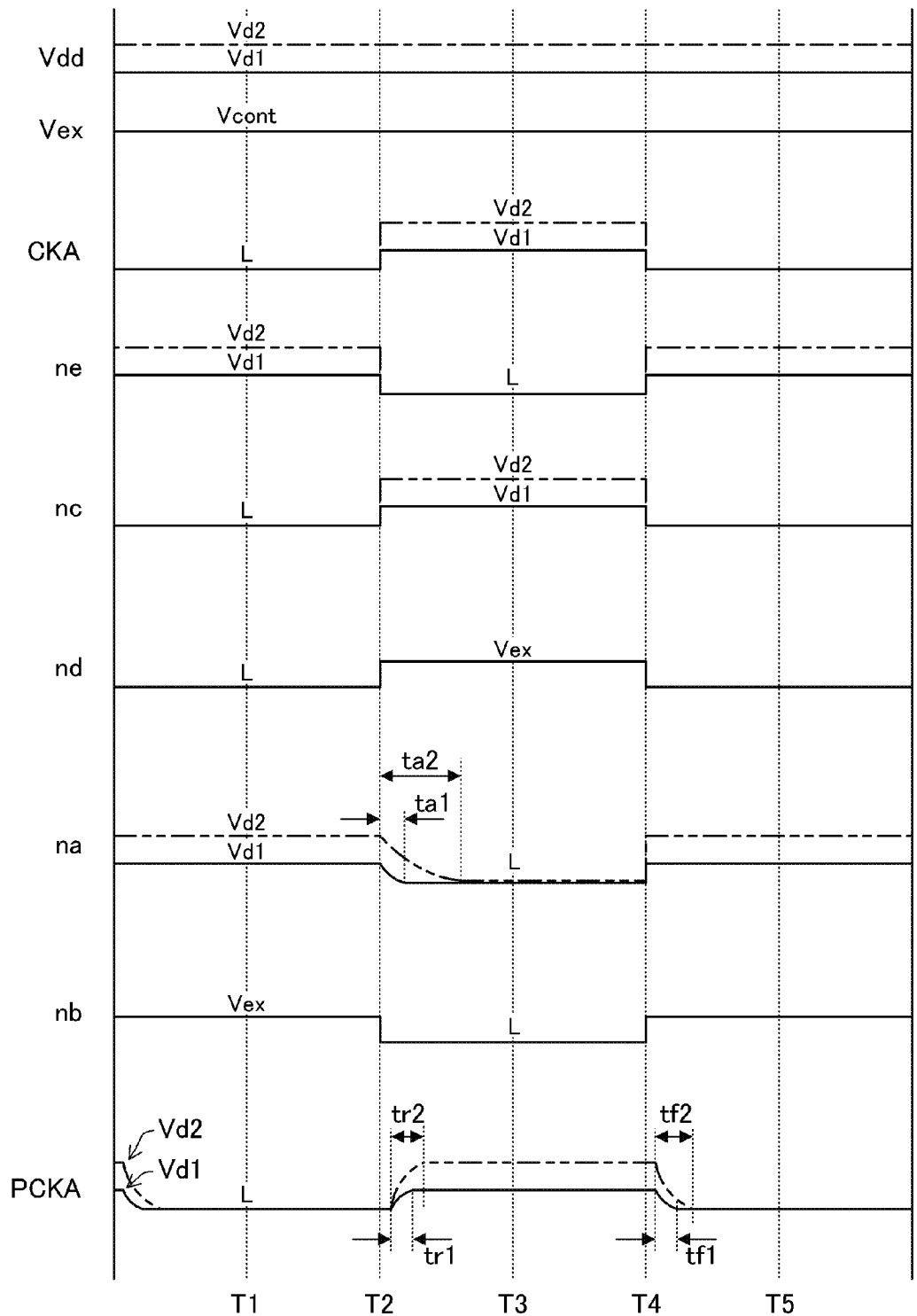
FIG. 9 is a timing chart of a booster circuit of the third embodiment.

Next, with reference to FIG. 9, operation of the clock buffer circuit 201A will be described. Initially, at time T1, the clock signal CKA is "L," a voltage at the intermediate terminal ne is "H," voltages at the intermediate terminals nc, nd are both "L," voltages at intermediate terminals na, nb are both "H," and a clock signal PCKA is "L." The voltage at the intermediate terminal na transitions between the power supply voltage Vdd (logical value "H") and ground (logical value "L"). Likewise, the voltages at the intermediate terminals ne, nc transition between the power supply voltage Vdd (logical value "H") and ground (logical value "L"). The voltage at the intermediate terminal nb transitions between the constant voltage Vex (logical value "H") and ground (logical value "L"). Likewise, the voltage at the intermediate terminal nd transitions between the constant voltage Vex (logical value "H") and ground (logical value "L").

At time T2, the clock signal CKA transitions from "L" to "H." This causes transition of an output of the inverter circuit 312 from "H" to "L," so that outputs of the inverter circuits 310, 311 transition from "L" to "H." Thus, the voltage at the intermediate terminal nb transitions to "L," and thus an n-channel transistor 122 transitions from a conductive state to a non-conductive state.

Moreover, logic transition of an output of an inverter circuit 123 and the output of the inverter circuit 311 occurs, so that a current Ia starts flowing from the intermediate terminal na to ground via the current source 126. The voltage at the intermediate terminal na gradually transitions from "H" to "L" during a time period ta1, and thus a p-channel transistor 121 gradually transitions from the non-conductive state to the conductive state during a time period tr1. This causes slow logic transition of the clock signal PCKA from "L" to "H."

As described above, the current source 126 is controlled with the inverter circuit 311, so that a through current via the p-channel transistor 121 and the n-channel transistor 122 can be reduced. The through current is caused by a difference in transition time period of the voltages at the intermediate terminals nc, nd, where the difference in transition time period results from a difference in characteristics of the inverter circuits 310, 311, and a difference in amplitude of the voltages at the intermediate terminals nc, nd.

At time T4, the clock signal CKA transitions from "H" to "L." This causes transition of the output of the inverter circuit 312 from "L" to "H," so that the outputs of the inverter circuits 310, 311 transition from "H" to "L." Thus, logic transition of the output of the inverter circuit 123 occurs, so that the voltage at the intermediate terminal na transitions to "H," and thus the p-channel transistor 121 transitions from the conductive state to the non-conductive state.

Moreover, logic transition of an output of the inverter circuit 128 and the output of the inverter circuit 310 allows a current Ib to start flowing from the constant voltage Vex to the intermediate terminal nb, so that the voltage at the intermediate terminal nb transitions from "L" to "H." The constant voltage Vex is applied to the gate of the n-channel transistor 122 regardless of the power supply voltage Vdd, and thus the n-channel transistor 122 operates as a constant current source. Therefore, the n-channel transistor 122 gradually transitions from the non-conductive state to the conductive state during a time period tf1. This causes slow logic transition of the clock signal PCKA from "H" to "L."

As described above, the current source 131 is controlled with the inverter circuit 310, so that the through current via the p-channel transistor 121 and the n-channel transistor 122 can be reduced. The through current is caused by a difference in transition time period of the voltages at the intermediate terminals nc, nd, where the difference in transition time period results from a difference in characteristics of the inverter circuits 310, 311, and a difference in amplitude of the voltages at the intermediate terminals nc, nd.

Moreover, for the inverter circuits 128, 311 driven at the constant voltage Vex lower than the power supply voltage Vdd, transistors having a small layout area can be used, where the transistors have a small thickness of an oxide film having characteristics different from the inverter circuit 310.

-Variation of Third Embodiment-

Figure 10:
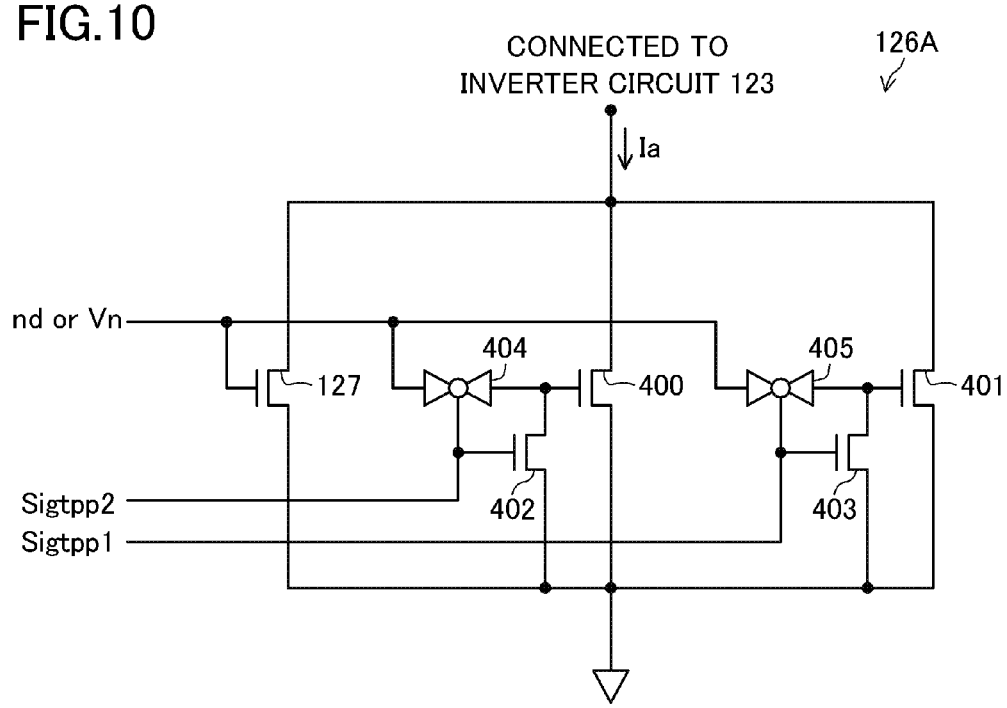
FIG. 10 is a view illustrating a configuration of a current source of a variation of the third embodiment.
Figure 11:
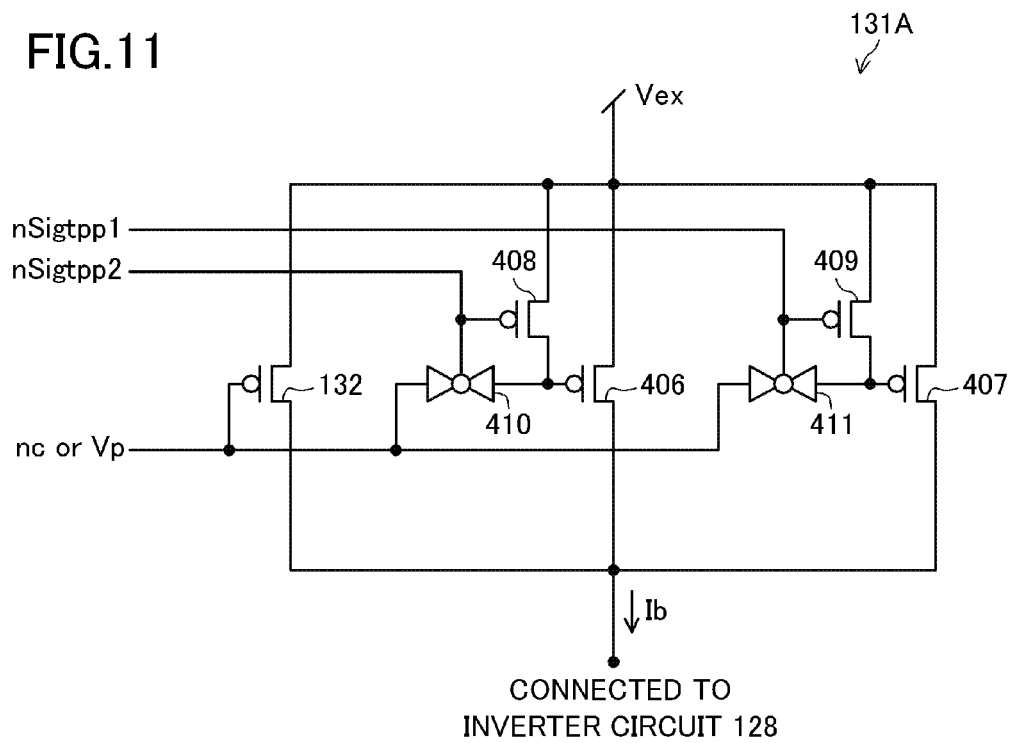
FIG. 11 is a view illustrating a configuration of a current source of a variation of the third embodiment.

FIG. 10 illustrates a variation of the current source 126 of the third embodiment. FIG. 11 illustrates a variation of the current source 131. A current source 126A is capable of switching the amount of a drain current based on control signals Sigtpp[2:1]. A current source 131A is capable of switching the amount of a drain current based on signals nSigtpp[2:1] which are inversion signals of the control signals Sigtpp[2:1].

Specifically, n-channel transistors 400, 401 adjust the amount of a current Ia. N-channel transistors 402, 403 cause the n-channel transistors 400, 401 to be in a non-conductive state based on the combination of the control signals Sigtpp[2:1]. Transfer gates 404, 405 are in a conductive state when the control signals Sigtpp[2:1] are "L."

P-channel transistors 406, 407 are configured to adjust a current Ib. P-channel transistors 408, 409 cause the p-channel transistors 406, 407 to be in the non-conductive state based on the combination of the signals nSigtpp[2:1]. Transfer gates 410, 411 are in the conductive state when the signals nSigtpp[2:1] are "H."

Using these components, the logical values of the control signals Sigtpp[2:1] are combined, so that the amounts of the currents Ia, Ib can be switched in the current sources 126A, 131A, respectively. Thus, transition time periods of clock signals PCKA, PCKB can be adjusted based on the setting of the control signals Sigtpp[2:1].

Note that since the transition time periods of the clock signals PCKA, PCKB can be adjusted based on the setting of the control signals Sigtpp[2:1], the current sources 126A, 131A are not necessarily configured as constant current sources. The clock buffer circuits 102, 103 of FIG. 3 may be replaced with the current sources 126A, 131A, respectively.

Figure 12:
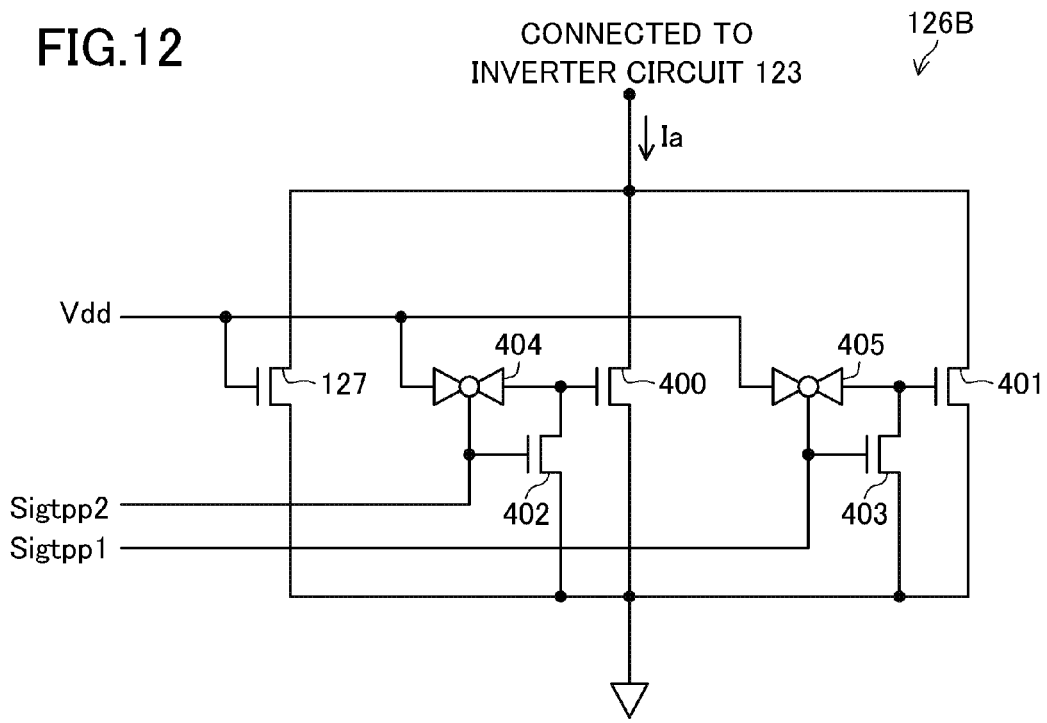
FIG. 12 is a view illustrating another configuration of the current source of the variation of FIG. 10 of the third embodiment.
Figure 13:
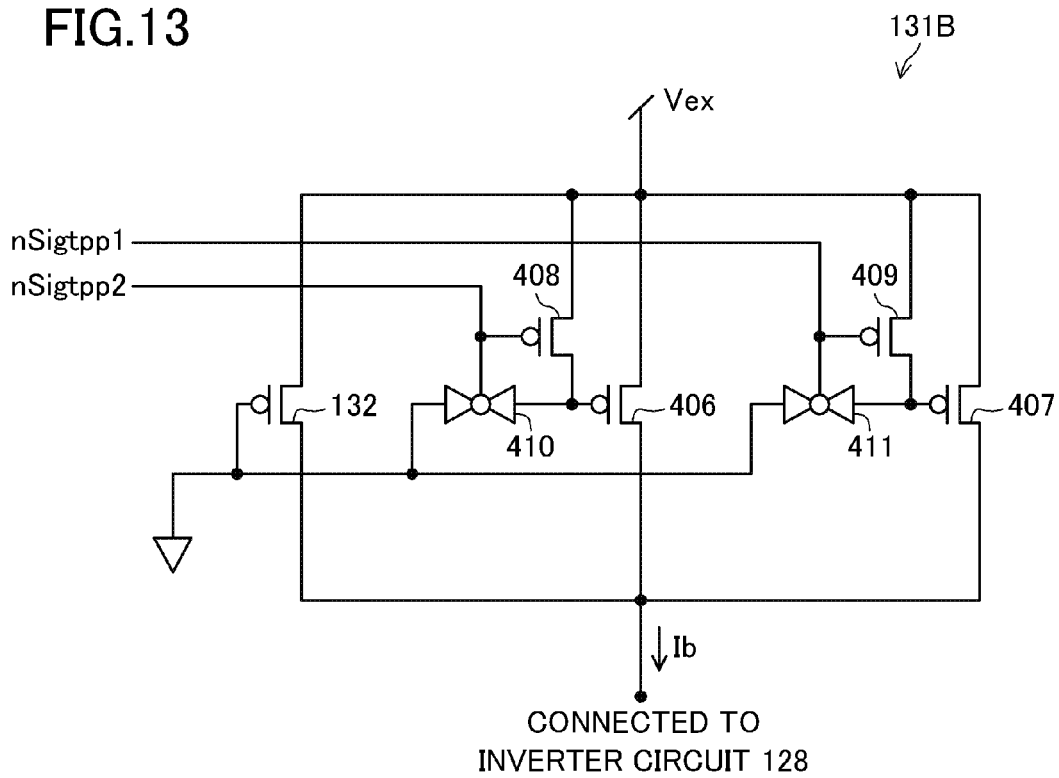
FIG. 13 is a view illustrating another configuration of the current source of the variation of FIG. 11 of the third embodiment.

Alternatively, as a current source 126B illustrated in FIG. 12, gates of n-channel transistors 127, 400, and 401 may be connected to a power supply voltage Vdd, and as a current source 131B illustrated in FIG. 13, gates of p-channel transistors 132, 406, and 407 may be connected to ground, and the combination of control signals Sigtpp[2:1] may be switched by the power supply voltage Vdd to adjust currents Ia, Ib. The transition time periods of the clock signals PCKA, PCKB can be set by combining the logical values of the control signals Sigtpp[2:1] also by using this configuration. Since drain currents of the current sources may be changed by the control signals, the control signals Sigtpp[2:1] may directly be connected to the gates of the n-channel transistors 400, 401, and the signals nSigtpp[2:1] may directly be connected to the gates of the p-channel transistors 406, 407. That is, any configuration may be possible as long as it serves the same function as that described above.

Although not shown, the configurations of FIGS. 10, 12 each can be a variation replacing the n-channel transistor 122 of FIGS. 3, 6, and 8. That is, an intermediate terminal nd (or a voltage Vn) of FIG. 10 and the power supply voltage Vdd of FIG. 12 each may be connected to the intermediate terminal nb of FIGS. 3, 6, and 8, and the terminal connected to the inverter circuit 123 may be connected to the terminal for the clock signal PCKA. With this configuration, it is possible to obtain the advantage that the clock signal PCKA stepwise falls based on the control signals.

Alternatively, although not shown, the configurations illustrated in FIGS. 11, 13 can be variations of the p-channel transistor 121 of FIGS. 3, 6, 8. That is, the intermediate terminal nc (or voltage Vp) of FIG. 11 and ground of FIG. 13 may be connected to the intermediate terminal na of FIGS. 3, 6, 8, and the terminal connected to the inverter circuit 128 may be connected to a terminal for the clock signal PCKA. With this configuration, it is possible to obtain the advantage that the clock signal PCKA stepwise rises based on the control signal.

Fourth Embodiment

Figure 14:
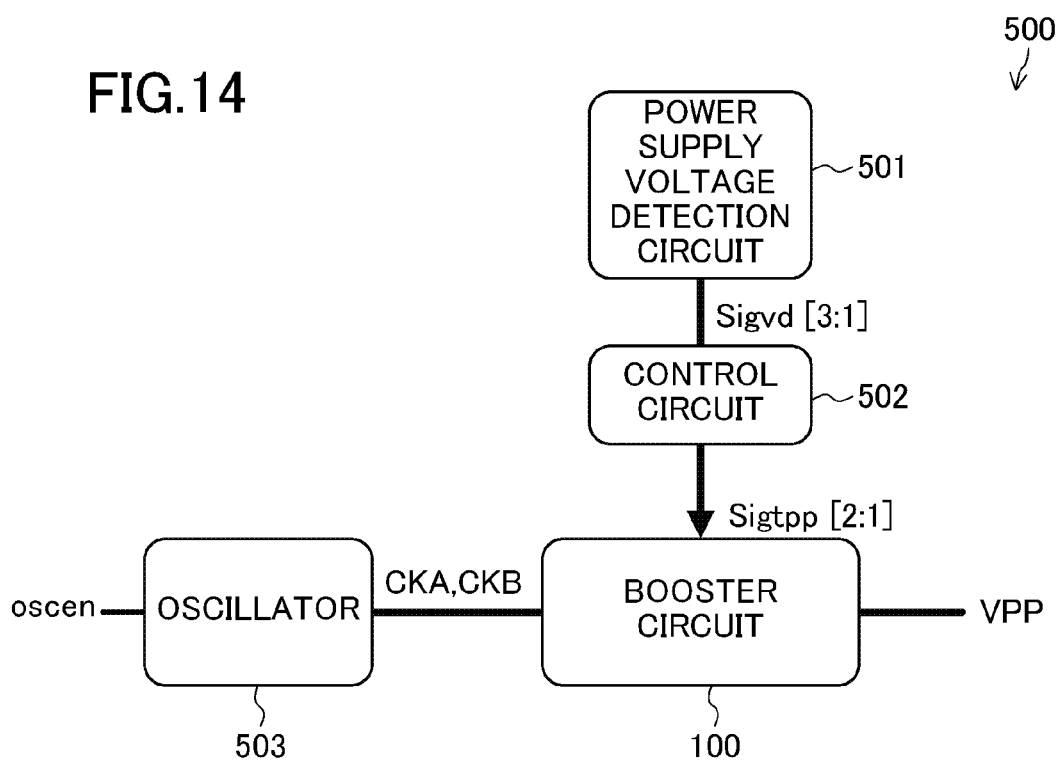
FIG. 14 is a view illustrating a configuration of a semiconductor integrated circuit of a fourth embodiment.

FIG. 14 is a view illustrating a configuration of a semiconductor integrated circuit 500 of a fourth embodiment, where, for example, a configuration to adjust the amounts of drain currents of the current sources of the variations of the third embodiment by a control signal is illustrated.

-Configuration of Semiconductor Integrated Circuit-

The semiconductor integrated circuit 500 includes: a power supply voltage detection circuit 501 configured to detect a power supply voltage Vdd to output voltage level signals Sigvd1-Sigvd3 based on the voltage level; a control circuit 502 configured to output control signals Sigtpp1, Sigtpp2 based on the voltage level signal Sigvd1-Sigvd3; an oscillator 503 configured to output clock signals CKA, CKB; and the booster circuit 100 of FIG. 1. Note that the booster circuit 200 of FIG. 5 may be used instead of the booster circuit 100.

-Configuration of Power Supply Voltage Detection Circuit-

Figure 15:
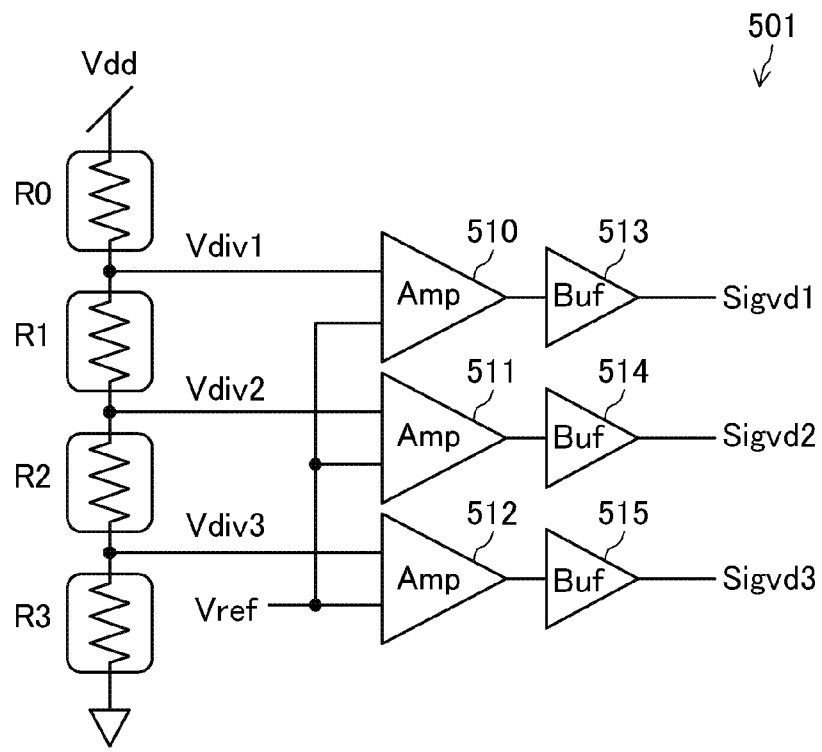
FIG. 15 is a view illustrating a configuration of a power supply voltage detection circuit of the fourth embodiment.
Figures 16, 17:
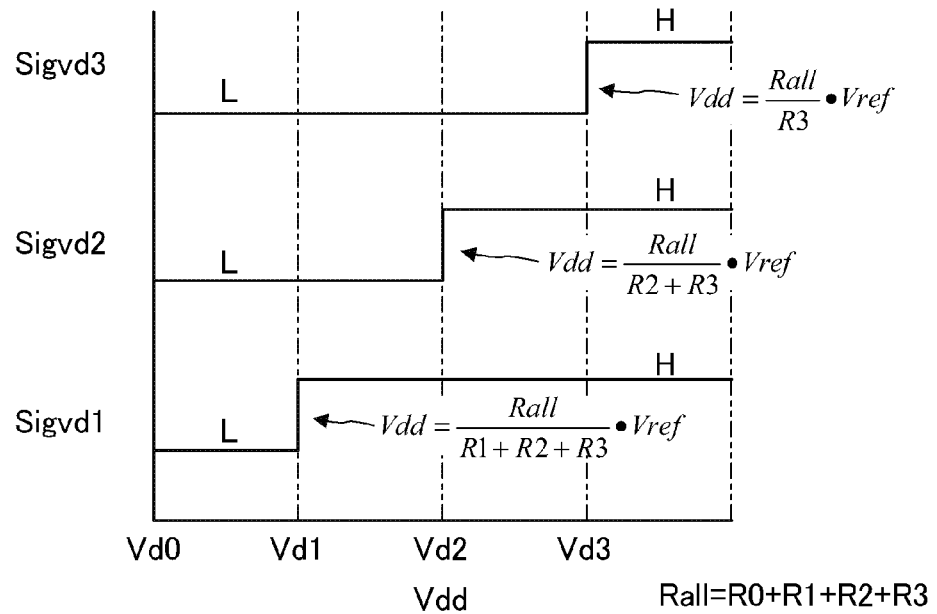
FIG. 16 is a graph illustrating the relationship of a power supply voltage relative to a voltage signal of the fourth embodiment.
FIG. 17 is a view illustrating the relationship of the power supply voltage relative to the voltage signal and a control signal of the fourth embodiment.

FIG. 15 illustrates an example of a configuration of the power supply voltage detection circuit 501. In the power supply voltage detection circuit 501, the power supply voltage Vdd is divided by resistive elements having resistance values R0-R3, and the voltage level of the power supply voltage Vdd is determined by differential amplifier circuits 510-512 respectively connected between the resistive elements. Voltage level signals Sigvd1-Sigvd3 are output via buffer circuits 513-515. FIG. 16 illustrates the relationship between the power supply voltage Vdd and the voltage level signals Sigvd1-Sigvd3. Rall is the sum total of the resistance values R0-R3 of the resistive elements of FIG. 15.

FIG. 17 is a view illustrating the relationship of the power supply voltage Vdd relative to the voltage level signals Sigvd1-Sigvd3 and the control signals Sigtpp1, 2. The control circuit 502 outputs the control signals Sigtpp[2:1] having control values illustrated in FIG. 17 based on the voltage level signals Sigvd[3:1].

-Operation-

Next, operation of the semiconductor integrated circuit 500 will briefly be described. Voltage levels Vd0-Vd3 of FIG. 16 have the following relationship: Vd0<Vd1<Vd2<Vd3. When the power supply voltage Vdd has a voltage level of Vd0, each of intermediate terminal voltages Vdiv1-Vdiv3 has a lower voltage value than a reference voltage Vref of each of the resistive elements. Thus, outputs of all the differential amplifier circuits 510-512 are all "L," so that the voltage level signals Sigvd[3:1] are "LLL."

When the power supply voltage Vdd is Vd1=Vref×Rall/(R1+R2+R3), only the intermediate terminal voltage Vdiv1 has a high voltage value than the reference voltage Vref. Thus, only an output of the differential amplifier circuit 510 is "H," so that the voltage level signals Sigvd[3:1] are "LLH."

When the power supply voltage Vdd is Vd2=Vref×Rall/(R2+R3), the intermediate terminal voltages Vdiv1, Vdiv2 each have a higher voltage value than the reference voltage Vref. Thus, the outputs of the differential amplifier circuits 510, 511 are "H," so that the voltage level signals Sigvd[3:1] are "LHH."

When the power supply voltage Vdd is Vd3=Vref×Rall/(R3), the intermediate terminal voltages Vdiv1-Vdiv3 each have a higher voltage value than the reference voltage Vref. Thus, the outputs of the differential amplifier circuits 510-512 are "H," so that the voltage level signals Sigvd[3:1] are "HHH."

Next, with reference to FIG. 17, operation of the booster circuit 100 of FIG. 14 will be described. The control circuit 502 outputs the control signals Sigtpp[2:1] based on the voltage level signals Sigvd[3:1] output from the power supply voltage detection circuit 501. Note that the control values of the control signals Sigtpp[2:1] are set such that the amounts of the currents Ia, Ib of the current sources 126A, 131A (see FIG. 10) decrease as the power supply voltage level increases.

The amount of the current Ia of the current source 126A is adjusted based on the control signals Sigtpp[2:1], and the amount of the current Ib of the current source 131A is adjusted based on the signals nSigtpp[2:1]. Thus, transition time periods of the clock signals PCKA, PCKB are adjusted. Therefore, it is possible to reduce high frequency noise which is generated along with an increase in power supply voltage Vdd.

Figure 18:
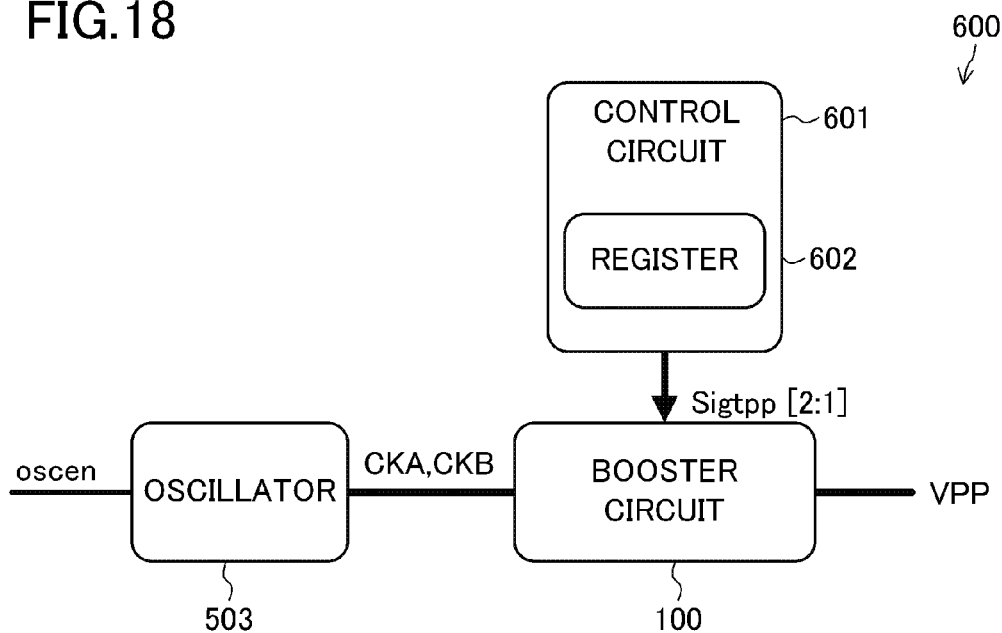
FIG. 18 is a view illustrating another configuration of the semiconductor integrated circuit of the fourth embodiment.

Note that the voltage level signal is not limited to 3 bits. The range of the power supply voltage is narrow, but values of the control signals Sigtpp[2:1] may be preset. For example, as a semiconductor integrated circuit 600 illustrated in FIG. 18, a control circuit 601 may include a register 602, in which control values of the control signals Sigtpp[2:1] may be specified.

Fifth Embodiment

Figure 19:
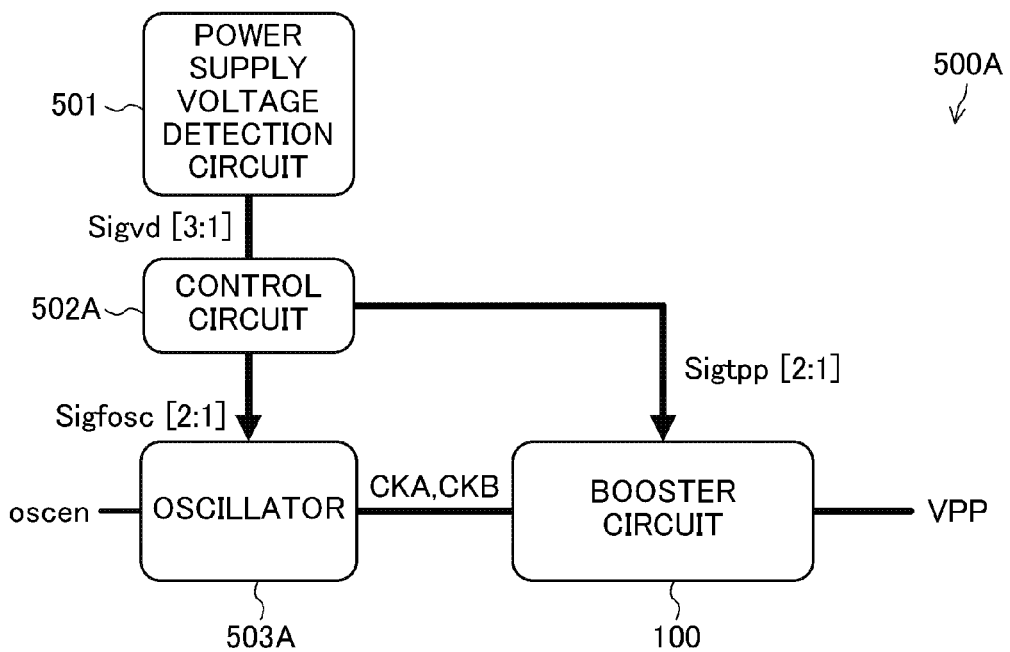
FIG. 19 is a view illustrating a configuration of a semiconductor integrated circuit of a fifth embodiment.
Figures 20, 21:
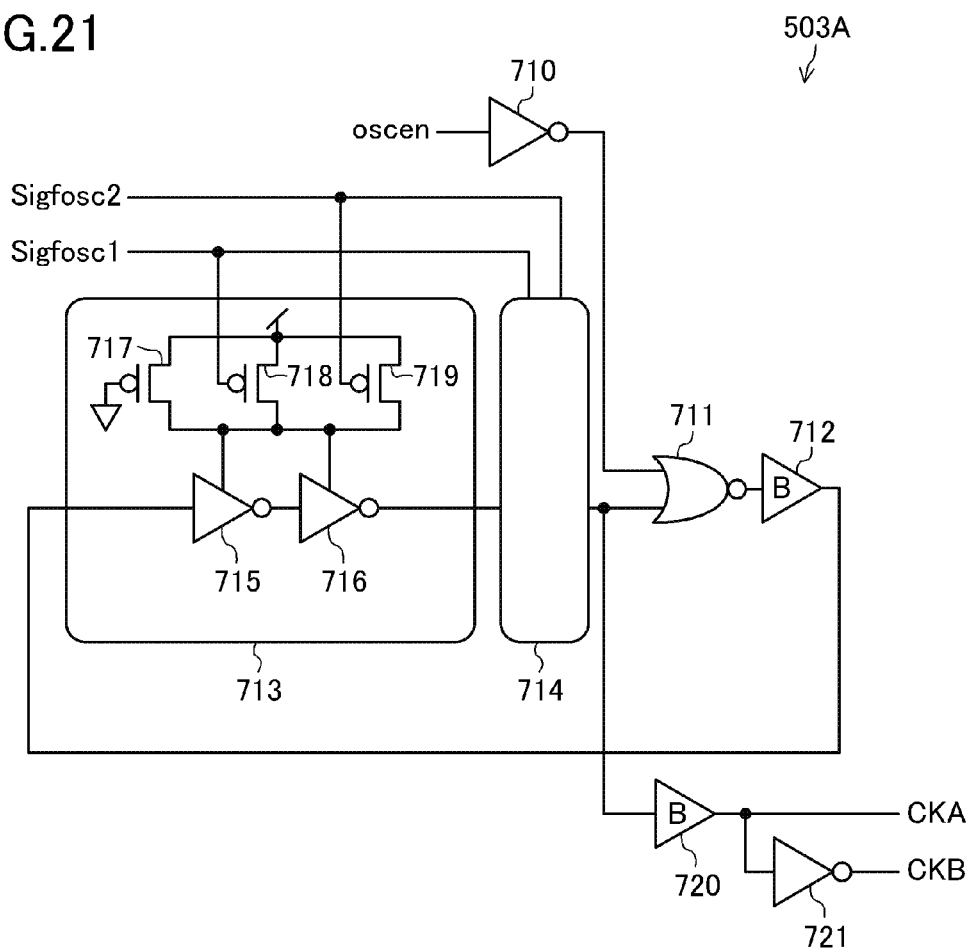
FIG. 20 is a view illustrating the relationship of a power supply voltage relative to a voltage signal and a control signal of the fifth embodiment.
FIG. 21 is a view illustrating a configuration of an oscillator of the fifth embodiment.

FIG. 19 is a view illustrating a configuration of a semiconductor integrated circuit 500A of a fifth embodiment. The differences between the fifth embodiment and the fourth embodiment will be described below. A control circuit 502A outputs frequency control signals Sigfosc[2:1] and control signals Sigtpp[2:1] based on power supply voltage level signals Sigvd[3:1]. FIG. 20 illustrates the relationship of a power supply voltage Vdd to the voltage level signals Sigvd1-Sigvd3, the control signals Sigtpp1, Sigtpp2, and the frequency control signals Sigfosc1, Sigfosc2.

-Configuration of Oscillator-

An oscillator 503A illustrated in FIG. 21 outputs a clock signal CKA from a buffer circuit 720 and a clock signal CKB from an inverter circuit 721 based on a signal oscen, where the clock signal CKA and the clock signal CKB each include a clock frequency fosc.

Specifically, as illustrated in FIG. 21, reference number 710 denotes an inverter circuit, and reference number 711 denotes a NOR circuit configured to control a ring oscillator by the signal oscen. Reference number 712 denotes a buffer circuit. Buffer circuits 713, 714 each include inverter circuits 715, 716 forming the ring oscillator, and p-channel transistors 717, 718, 719 configured to control the operating speed of the inverter circuits 715, 716.

In the oscillator 503A, the drain capability of the p-channel transistors 718, 719 is changed based on the combination of the frequency control signals Sigfosc[2:1], which changes the operating speed of the inverter circuits 715, 716, thereby determining the clock frequencies fosc.

-Operation-

With reference to FIGS. 20, 21, operation of the semiconductor integrated circuit 500A of FIG. 19 will briefly be described. The control circuit 502A outputs, based on the voltage level signals Sigvd[3:1], the frequency control signals Sigfosc[2:1] and the control signals Sigtpp[2:1] to determine the clock frequencies fosc of the oscillator 503A as illustrated in FIG. 20.

Here, setting is made such that as the power supply voltage Vdd increases, the clock frequencies fosc lower, and the transition time periods of clock signals PCKA, PCKB increase.

The oscillator 503A outputs the clock signals CKA, CKB while switching the clock frequencies fosc based on the frequency control signals Sigfosc[2:1].

In contrast, in the booster circuit 100, the transition time periods of the clock signals PCKA, PCKB are adjusted based on the control signals Sigtpp[2:1].

Here, in a conventional booster circuit, a transition time period of an output of a driver circuit is adjusted in order to reduce the rate of change in a current in the driver circuit. However, in the conventional booster circuit, the transition time period of the output of the driver circuit is not controlled in conjunction with a clock frequency fosc. Therefore, when voltage transition of the output of the driver circuit is slow, a time period in which charge is transferred from an upstream stage to a downstream stage in a charge transfer section of the booster circuit (charge transfer time period) may be insufficient. In contrast, when it is attempted to ensure a margin for the charge transfer time period, the voltage transition of the output may not be slow enough.

According to the present embodiment, even when an increase in power supply voltage Vdd increases the transition time periods of clock signals PCKA, PCKB, clock frequencies of the clock signals PCKA, PCKB can be lowered, so that the margin for the charge transfer time period of the booster circuit 100 can be ensured, thereby limiting a reduction in boosting efficiency to a lesser extent.

Although adjusting the clock frequencies of the clock signals CKA, CKB output from the oscillator 503A has been described as an example of a means to control the clock frequency of the clock signals PCKA, PCKB, a divider circuit may be provided between the oscillator 503A and the booster circuit 100 to change the frequency dividing rate based on the frequency control signals Sigfosc[2:1], thereby changing the clock frequencies of the clock signals CKA, CKB.

Figure 22:
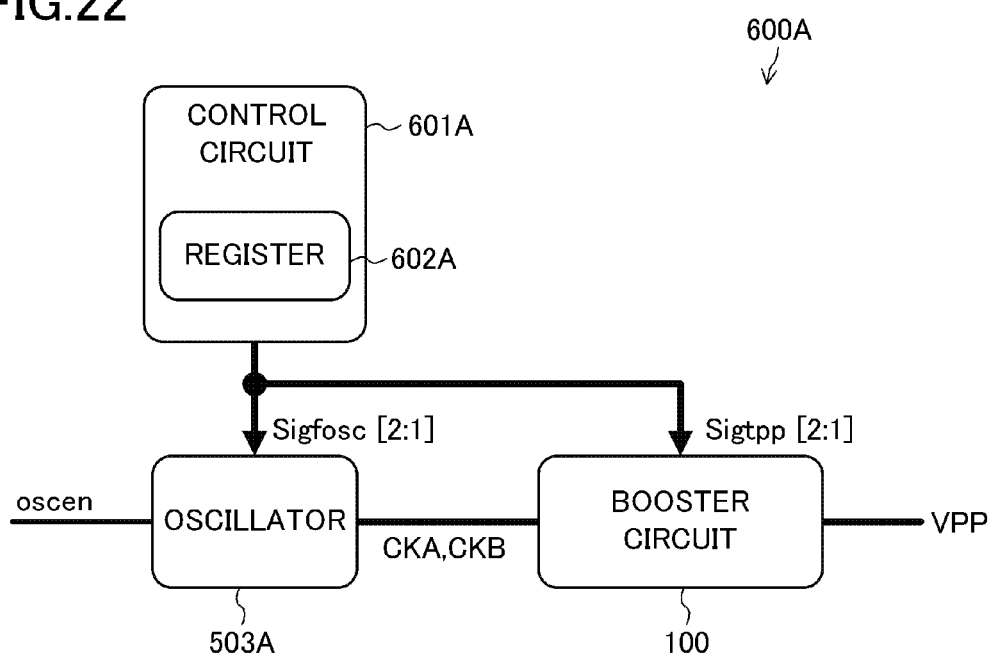
FIG. 22 is a view illustrating another configuration of the semiconductor integrated circuit of the fifth embodiment.

Note that the control values of the control signals Sigtpp[2:1] and the frequency control signals Sigfosc[2:1] may be preset. For example, as a semiconductor integrated circuit 600A illustrated in FIG. 22, a control circuit 601A may include a register 602A, in which the control values of the control signals Sigtpp[2:1] and the control values of the frequency control signals Sigfosc[2:1] may be specified.

What is claimed is:

1. A semiconductor integrated circuit comprising:
   a first transistor and a second transistor which are connected in series between a first voltage and a second voltage which is lower than the first voltage;
   a first inverter configured to control the first transistor;
   a second inverter configured to control the second transistor; and
   a current source, wherein
   the current source is connected in series with at least one of the first inverter or the second inverter, and
   a current amount of the current source is independent of the first voltage.

2. The semiconductor integrated circuit of claim 1, wherein the current source is a constant current source to which a constant voltage is applied.

3. The semiconductor integrated circuit of claim 1, wherein a current value of the current source is controlled based on a clock signal.

4. The semiconductor integrated circuit of claim 1, wherein the second inverter is supplied with a third voltage.

5. The semiconductor integrated circuit of claim 1, wherein the current source is configured to switch between a plurality of current values.

6. The semiconductor integrated circuit of claim 1, further comprising:
   a control circuit including a register, wherein
   a current value of the current source is set based on a value specified in the register.

7. The semiconductor integrated circuit of claim 1, wherein a current value of the current source is set based on an output signal of a voltage detection circuit configured to detect a voltage level of an external power supply voltage.

8. A booster circuit comprising:
   the semiconductor integrated circuit of claim 1; and
   a boosting capacitor having a terminal connected to the semiconductor integrated circuit.

9. A semiconductor integrated circuit comprising:
   a first transistor provided between a first voltage and an output terminal;
   a second transistor provided between the output terminal and a second voltage which is lower than the first voltage;
   a first inverter connected to a gate of the first transistor;
   a second inverter connected to a gate of the second transistor; and
   at least one of a first current source provided between the first inverter and the second voltage and having a current amount independent of the second voltage or a second current source provided between the first voltage and the second inverter and having a current amount independent of the first voltage.

10. The semiconductor integrated circuit of claim 9, wherein at least one of the first current source or the second current source is controlled by a constant voltage applied thereto.

11. The semiconductor integrated circuit of claim 9, wherein
   both the first current source and the second current source are provided,
   the first current source is controlled by a first clock signal input to the second inverter, and
   the second current source is controlled by a second clock signal input to the first inverter.

12. The semiconductor integrated circuit of claim 9, further comprising:
a control circuit including a register, wherein
a current value of the current source is set based on a value specified in the register.

13. The semiconductor integrated circuit of claim 9, wherein a current value of the current source is set based on an output signal of a voltage detection circuit configured to detect a voltage level of an external power supply voltage.

14. The semiconductor integrated circuit of claim 11, further comprising:
a control circuit including a register, wherein
the control circuit sets current values of the first current source and the second current source and frequencies of the first clock signal and the second clock signal based on a value specified in the register.

15. The semiconductor integrated circuit of claim 11, further comprising:
a control circuit configured to set frequencies of the first clock signal and the second clock signal based on an output signal of a voltage detection circuit configured to detect a voltage level of an external power supply voltage, wherein
current values of the first current source and the second current source are set based on the output signal of the voltage detection circuit.

16. A booster circuit comprising:
the semiconductor integrated circuit of claim 9; and
a boosting capacitor having a terminal connected to the semiconductor integrated circuit.

17. A semiconductor integrated circuit comprising:
a first transistor provided between a first voltage and an output terminal;
a second transistor provided between the output terminal and a second voltage which is lower than the first voltage;
a first inverter connected to a gate of the first transistor;
a second inverter connected to a gate of the second transistor; and
at least one of a first current source provided between the first inverter and the second voltage and having a current amount independent of the second voltage or a second current source provided between a third voltage and the second inverter and having a current amount independent of the third voltage.

18. The semiconductor integrated circuit of claim 17, wherein at least one of the first current source or the second current source is controlled by a constant voltage applied thereto.

19. The semiconductor integrated circuit of claim 17, wherein
both the first current source and the second current source are provided,
the first current source is controlled by a first clock signal input to the second inverter, and
the second current source is controlled by a second clock signal input to the first inverter.

20. The semiconductor integrated circuit of claim 17, further comprising:
a control circuit including a register, wherein
a current value of the current source is set based on a value specified in the register.

21. The semiconductor integrated circuit of claim 17, wherein a current value of the current source is set based on an output signal of a voltage detection circuit configured to detect a voltage level of an external power supply voltage.

22. The semiconductor integrated circuit of claim 19, further comprising:
a control circuit including a register, wherein
the control circuit sets current values of the first current source and the second current source and frequencies of the first clock signal and the second clock signal based on a value specified in the register.

23. The semiconductor integrated circuit of claim 19, further comprising:
a control circuit configured to set frequencies of the first clock signal and the second clock signal based on an output signal of a voltage detection circuit configured to detect a voltage level of an external power supply voltage, wherein
current values of the first current source and the second current source are set based on the output signal of the voltage detection circuit.

24. A booster circuit comprising:
the semiconductor integrated circuit of claim 17; and
a boosting capacitor having a terminal connected to the semiconductor integrated circuit.

* * * * *